United States Patent [19]

Hall et al.

[11] 4,153,849

[45] May 8, 1979

[54] CIRCUIT FOR NORMALIZING DEVICES HAVING CURRENT-CONTROLLED FREQUENCY RESPONSE TO PREDETERMINED I-F CHARACTERISTIC

[75] Inventors: Stanley R. Hall, Westlake Village; Armando Benavides, Los Angeles, both of Calif.

[73] Assignee: Bunker Ramo Corporation, Oak Brook, Ill.

[21] Appl. No.: 820,689

[22] Filed: Aug. 1, 1977

[51] Int. Cl.² .............................................. H03K 1/02
[52] U.S. Cl. .................................... 307/295; 307/297; 331/177 R; 330/85; 330/112; 330/291
[58] Field of Search ................... 307/295, 297; 331/16, 331/94, 177 R; 330/85, 112, 291

[56] References Cited

U.S. PATENT DOCUMENTS

| | | | |
|---|---|---|---|
| 3,259,833 | 7/1966 | Barter | 307/297 |
| 3,783,409 | 1/1974 | Polson | 331/177 R |
| 3,869,674 | 3/1975 | Borbely | 331/16 X |
| 3,936,675 | 2/1976 | Yoshida | 307/295 X |

Primary Examiner—John S. Heyman
Attorney, Agent, or Firm—F. M. Arbuckle; A. Freilich

[57] ABSTRACT

Circuits are disclosed for normalizing a device which has a current-controlled frequency response, such as a YIG or a TWM device, to a predetermined current-frequency (I-F) characteristic in order that a device equipped with such a circuit can be preadjusted for substitution in a system for a like device without realigning the system. The normalizing circuit is in parallel with the device, and is comprised of a transistor and a compensating current-sensing resistor in series with the transistor. A shunt compensating current, $I_C$, through the transistor is set by a voltage on a potentiometer to offset the I-F characteristic of the composite device and circuit from that of the device to a predetermined level and also by a feedback control circuit connected to the compensating current-sensing resistor. The slope of the offset characteristic is then adjusted to a predetermined value by adjusting the gain of a feedback control circuit between the transistor and a resistor which senses a voltage, $V_S$, proportional to the current, $I_T$, which is the sum of the drive current, $I_Y$, through the device and the shunted compensating current, $I_C$, through the transistor.

12 Claims, 4 Drawing Figures

NORMALIZING CIRCUIT SYSTEM

CIRCUIT FOR NORMALIZING DEVICES HAVING CURRENT-CONTROLLED FREQUENCY RESPONSE TO PREDETERMINED I-F CHARACTERISTIC

BACKGROUND OF THE INVENTION

This invention relates to devices used in microwave systems, and more particularly to a circuit for normalizing the operating characteristic of devices tuned by a controlled current to permit devices to be interchanged without requiring realignment in the systems. There are at least two general classes of such devices: yttrium-iron-garnet (YIG) devices and traveling-wave maser (TWM) devices.

YIG devices are small solid-state devices that contain ytrrium-iron-garnet crystals used in combination with a controlled magnetic field for tuning. Such devices, which have been described in the literature, are used as oscillators, filters or harmonic generators. A single-crystal YIG sphere in a magnetic field is used as the tuning element in such devices because of the YIG's high "Q" resonance characteristic over wide frequency ranges. The technique for tuning the YIG device involves application of an external DC magnetic field which interacts with magnetic dipoles created by spinning electrons in the YIG sphere to cause them to align themselves in the direction of the field. Any magnetic force at right angles to the DC magnetic field causes the dipoles to precess about the fixed direction of the DC magnetic field. Since the rate of precession depends upon the strength of the net magnetic field, it is possible to tune the YIG device over a wide range by control of the field, and to then modulate the magnetic force at right angles to the DC magnetic field created in a small air gap between poles of a high permeability material in a pair of coaxial tuning coils. The problem with tuning YIG devices is that different devices have different current-frequency characteristics. Consequently, once a device is tuned for operation in a system, it can not be replaced with another device without realignment of the system.

The goal of interchangeability of YIG devices in microwave systems is important to facilitate maintenance of the system by simply substituting functional units containing YIG devices, or simply substituting YIG devices, without any realignment. The unit to unit variability of YIG-device performance in the system is often beyond the range which can be tolerated for reliable system operation, thus requiring realignment unless the replacement unit is so configured that it includes all of its drive circuits so that it can be prealigned for the system. It is not always feasible to so configure the units for replacement. To assure interchangeability, it is desirable to add to each interchangeable unit (YIG device) a circuit which normalizes the YIG device to some predetermined current-frequency characteristic.

TWM devices, which have been described in the literature, are very similar to YIG devices in that a DC magnetic field is required for maser operation, and the strength of the DC magnetic field must be adjusted for tuning the center frequency, gain and bandwidth. In some applications, an additional set of coils may be distributed along the length of the TWM structure for stagger tuning in order to shape the frequency response characteristic of the device. It may be desirable to normalize TWM devices in the same manner as YIG devices. Still other types of devices which rely on a controlled current to define its operating characteristics may be normalized by a circuit in the same manner.

SUMMARY OF THE INVENTION

In accordance with an important aspect of an exemplary embodiment any one of a number of devices having different characteristics for operation in response to a controlled current in a system may be normalized to a predetermined characteristic by connecting a normalizing circuit in parallel with the device such that the composite of the device and normalizing circuit provides an offset characteristic at a level of control current above the upper limit of the characteristics of all of the devices. The source of controlled current for the device includes means for producing a voltage, $V_s$, proportional to the system-controlled current, $I_T$, in order to provide the system with feedback control of the current. To effect normalization, the normalizing circuit includes an electronically-controlled variable-resistance element controlled by circuit means in response to the voltage $V_s$ to bypass (subtract) current from the device.

Given a predetermined set of controlled currents and their corresponding sense voltages at the low and high ends of the different operating characteristics of all substitutable devices, any one of the substitutable devices may be pretuned to the same offset characteristic above the range of the predetermined set of the different device characteristics, thus normalizing the characteristics of all substitutable devices to the same offset characteristics for operation in the system without realignment in the system. In series with the electronically-controlled variable-resistance element is a fixed resistor provided to obtain a voltage signal across it for feedback control to the variable-resistance element, thereby to stabilize the static level of the offset characteristic. Feedback control to the variable resistance element is provided from the sensed voltage, $V_s$. The slope of the offset characteristic is set by adjusting the gain of the aforesaid feedback control to provide the necessary gain.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1:
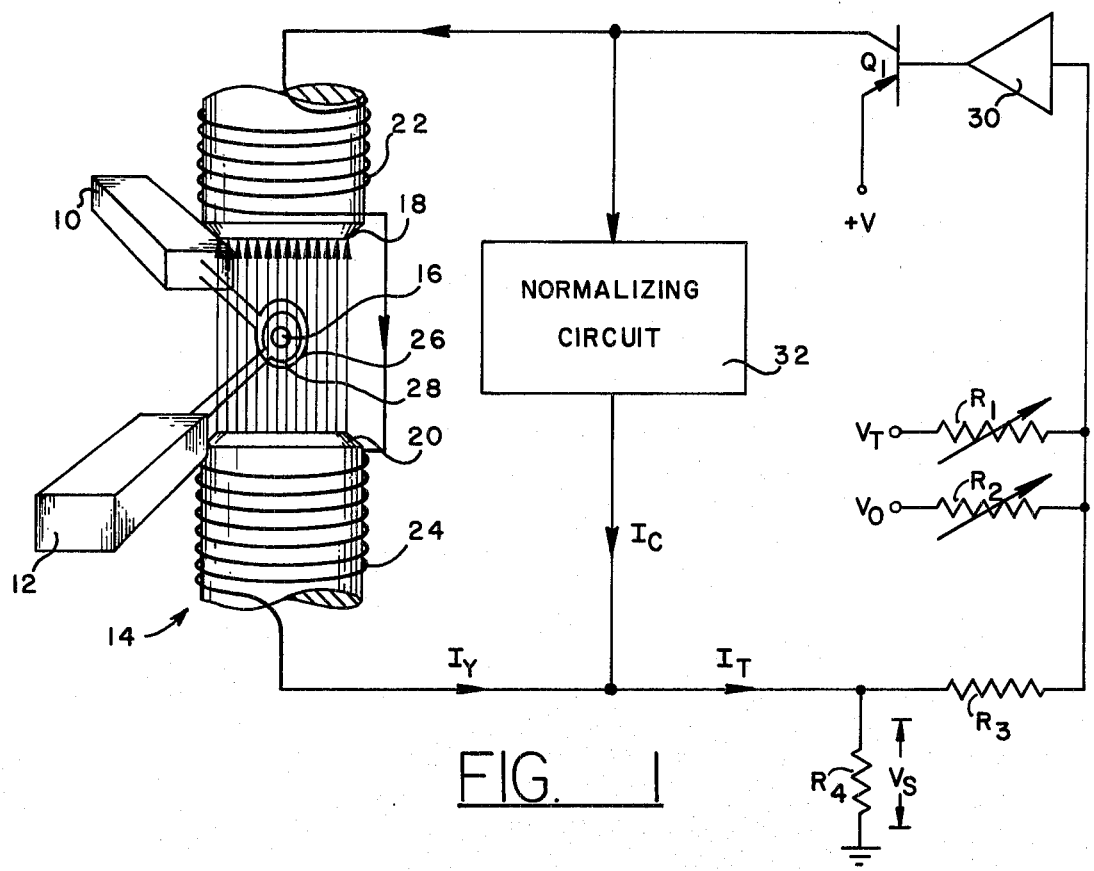
FIG. 1 illustrates schematically a YIG device useful in a microwave system represented by a signal source and a load.

Referring now to FIG. 1 of the drawings, a microwave system is represented by a signal source box 10 coupled to a load box 12 by a YIG device 14 comprised of an yttrium-iron-garnet single-crystal sphere 16 in an air gap between electromagnet poles 18 and 20. Symmetric coils 22 and 24 surround the poles. In practice, high permeability material used for the poles is extended around the outside of the coils to completely enclose coils and poles to minimize flux leakage from the gap and provide a high degree of shielding from external magnetic flux. The design of the poles and the air gap is such that the gap reluctance determines the relationship between tuning current and flux.

The crystal sphere provides a resonance that is explained in terms of spinning electrons that create a net magnetic amount (dipole) in each molecule within the crystal sphere. The uniform magnetic field produced by the electromagnet causes the dipoles to align themselves in the direction of the flux. A magnetic force at right angles to the flux produced by a signal from the source 10 through a coupling loop causes the dipoles to precess around the direction of the electromagnet flux. The rate of precession depends upon the strength of the electromagnetic field, and therefore upon a tuning voltage which controls the drive current to the electromagnet. The drive current thus controls the frequency of the YIG device. An output coupling loop 28 provides an output signal to the load.

FIG. 1 shows schematically the YIG electromagnet driver comprising an amplifier 30 and a PNP transistor $Q_1$. The total drive current, $I_T$, is controlled by a tuning voltage, $V_T$, and an offset voltage, $V_o$. Typically, the tuning voltage varies between $-4.7$ and $-5.3$ volts to tune over the entire RF band of 12.4 GHz to 18 GHz. Potentiometers $R_1$ and $R_2$ represent gain and offset adjustments, respectively. Resistors $R_3$ and $R_4$ provide feedback control. By simple circuit analysis, it can be shown that the sense voltage, $V_s$, across resistor $R_4$ is given by $$V_s = \frac{R_3}{R_1} V_T - \frac{R_3}{R_2} V_o \qquad (1)$$

and that the total current is given by $$I_T = \frac{V_s}{R_4},$$

assuming the feedback current through resistor $R_3$ is negligible because $R_3$ is larger than $R_4$ by several orders of magnitude.

A normalizing circuit 32 is connected in parallel with the series-connected coils 22 and 24. The circuit is of such a design that the composite of the YIG device and the normalizing circuit provides a predetermined current-frequency characteristic in order that the device which may be any one of a supply of "spare parts" inserted into the system will have a predetermined tuning sensitivity. In that manner, when a YIG device is interchanged in the system, there is no necessity to realign other boxes or system components. Exemplary normalizing circuits are disclosed in FIGS. 3 and 4.

Before describing the exemplary normalizing circuits, the nature of the normalization to be achieved will be discussed with reference to FIG. 2 which shows typical current-frequency characteristics for a YIG device operating as a voltage-controlled oscillator anywhere within the limits of 12.56 GHz at 667.9 ma to 18.16 GHz at 991.6 ma as a lower limit to 12.56 GHz at 667.9 ma to 18.16 GHz at 1140.8 ma as an upper limit. Devices having such wide tolerance specifications cannot be replaced in a system without realigning the system for the particular characteristic of the device being installed in the system. By adding a normalizing circuit to the device, the frequency-current characteristic of the combination can be made to conform to a predetermined response with the necessary sensitivity (slope of the characteristic) outside the upper limit of the manufacturer's specification, such as 12.56 GHz at 789.1 ma with a slope, S, of 15.7 MHz per milliamper. This is accomplished by the normalizing circuit in parallel with the device conducting sufficient compensation current, $I_c$, from the total drive current, $I_T$, to yield the necessary device current, $I_y$, for operation with the necessary slope at the higher drive current levels. In other words, given a pre-established set of total driver currents, $I_T$, with their corresponding sense voltages, $V_s$, at the low and high ends of the specification limits, different YIG devices of the same type and frequency range can be made to tune identically by a circuit that controls the compensating current, $I_c$, which subtracts from the total current, thus establishing the required device current, $I_y$, necessary to obtain the desired frequency-driver current characteristic defined by an offset voltage, $V_c$, and slope controls.

Figure 3:
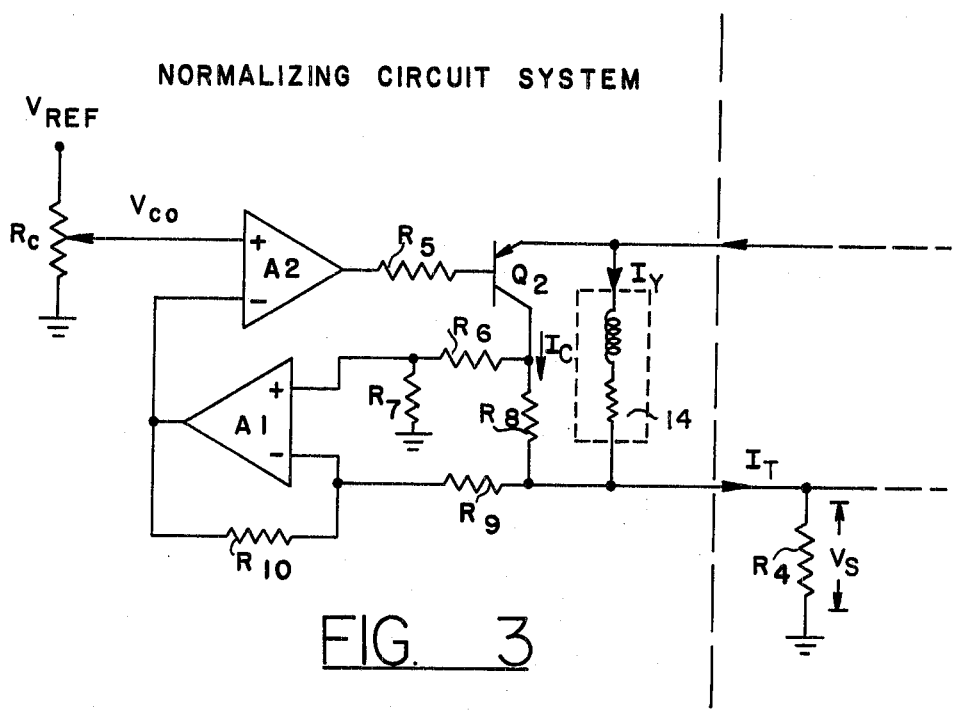
FIG. 3 is a circuit diagram of a first embodiment of a normalizing circuit.

Referring now to FIG. 3, an exemplary normalizing circuit is comprised of a transistor $Q_2$ controlled through a resistor $R_5$ to effectively vary its resistance which is in series with voltage dividing resistors $R_6$ and $R_7$, and in series with a resistor $R_8$, which is in turn connected in series with resistor $R_4$ of the device driver shown in FIG. 1 and repeated in FIG. 3 for convenient reference. The voltage $V_s$ sensed across the resistor $R_4$ is a function of the total drive current $I_T$ conducted through the device and the transistor $Q_2$ in series with resistor $R_8$. Resistors $R_6$ and $R_7$ are several orders of magnitude greater than the resistor $R_8$ so that they conduct a negligible amount of the total current subtracted by the transistor $Q_2$. Those voltage-dividing resistors function to maintain the equality of the equation $I_y = I_T - I_c$. For a constant total current, any increase in $I_y$ is sensed as an increase in the voltage at the junction of resistors $R_6$ and $R_7$. That increase in voltage is compared to a voltage proportional to $V_s$ by an operational amplifier A1 and applied as a feedback signal which in turn is also being compared to $V_{co}$ via an operational amplifier A2.

Figure 2:
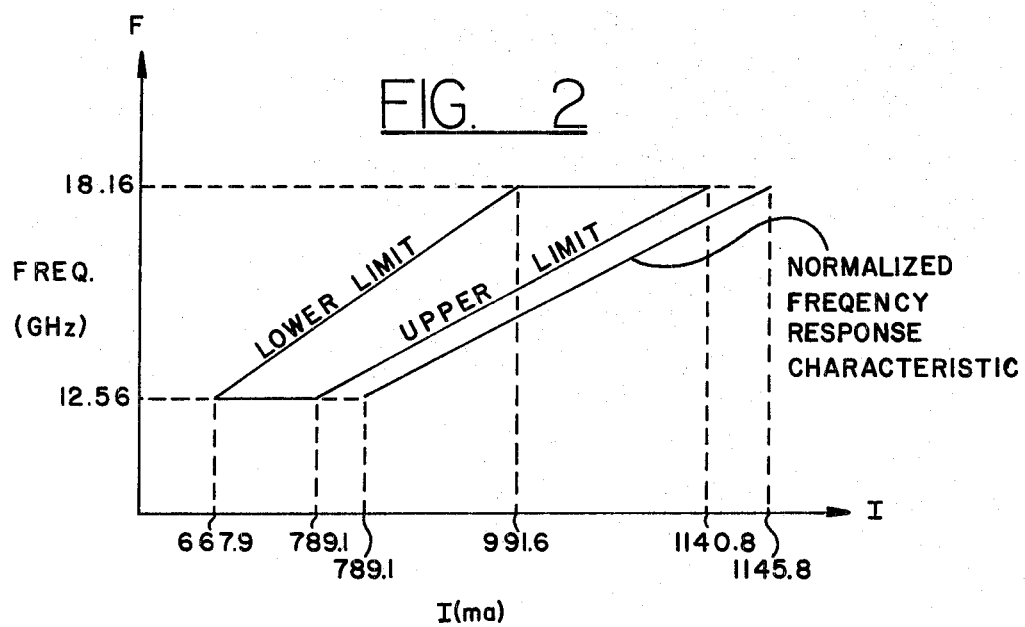
FIG. 2 is a graph of a set of current-frequency characteristics defining specification limits of the YIG device of FIG. 1 without a normalizing circuit, and a graph of a normalized current-frequency response for any one of like devices having a normalizing circuit as shown in FIG. 1.

While this feedback arrangement maintains the compensation current constant, and therefore maintains the device response constant for a constant drive current $I_T$, a compensation voltage, $V_c$, is added to the feedback signal at the amplifier A2 to shift the response of the device to the predetermined current-frequency characteristic required by the prealigned system in which the device is to be used, such as to the right in FIG. 2. The slope of the current-frequency response of the device is then adjusted to the predetermined current by the ratio of the resistors $R_9$ and $R_{10}$ which set the gain of the amplifier A1. The driver current may then be varied to vary the device frequency in accordance with the predetermined current-frequency characteristic. Since the uncompensated device characteristic will vary from one device to the other within the limits of the manufacturer's limits, the offset and slope for each device must be adjusted individually, but once adjusted, any device may be substituted in the system.

The operation of the normalizing circuit may be mathematically expressed by an equation for the compensation current as follows:

$$I_C = \frac{1}{R_g} \left[ V_C \left( \frac{R_6 \times R_7}{R_7} \cdot \frac{R_9}{R_9 + R_{10}} \right) + V_s \left( \frac{R_{10}}{R_9 + R_{10}} \cdot \frac{R_6 + R_7}{R_7} - 1 \right) \right] \quad (3)$$

Letting $$G_4 = \frac{R_3}{R_1 R_4}, \quad V_1 = \frac{R_1}{R_2} V_0,$$

$$K_7 = \frac{R_7}{R_6 + R_7}, \quad K_{10} = \frac{R_{10}}{R_9 + R_{10}},$$

$$I_8 = \frac{V_C}{R_8}, \quad \text{and} \quad K_8 = \frac{R_8}{R_4}.$$

Then $$I_T = -G_4(V_T + V_1) \quad (4)$$

$$I_C = \frac{I_8(1 - K_{10})}{K_7} + \frac{G_4}{K_8} \left( \frac{K_{10}}{K_7} - 1 \right) [-(V_T + V_1)] \quad (5)$$

So that $$I_Y = I_T - I_C = G_4 \left[ 1 - \frac{1}{K_8} \left( \frac{K_{10}}{K_7} - 1 \right) \right] [-(V_T + V_1)] - \frac{I_8(1 - K_{10})}{K_7}$$

The frequency of the YIG device is given by $$f = f_L + S(I_Y - I_L), \quad (6)$$

Where $f_L$ = lowest frequency of the RF band, and $I_L$ = current required to tune to $f_L$.
Then $$\frac{f - f_L}{S} = I_L + \frac{I_8(1 - K_{10})}{K_7} + \frac{I_8(-K_{10})}{K_7} + V_1 \left\{ G_4 \left[ 1 - \frac{1}{K_8} \left( \frac{K_{10}}{K_7} - 1 \right) \right] \right\} \quad (7)$$

$$- V_T \left\{ G_4 \left[ 1 - \frac{1}{K_8} \left( \frac{K_{10}}{K_7} - 1 \right) \right] \right\}$$

The desired response of the driver and normalizing circuit combination is $$f = f_L - G_f V_T \quad (8)$$

so that with $V_T = 0$; $f = f_L$,
and with $V_T = -V_H$, $f = f_L + G_S V_H = f_H$
where $f_H$ = highest frequency in a given band,
and $V_H$ = magnitude of voltage to tune to $f_H$.
To put equation (7) into the form of equation (8) requires $$G_f = S G_4 \left[ 1 - \frac{1}{K_8} \left( \frac{K_{10}}{K_7} - 1 \right) \right] = \frac{f_H - f_L}{V_H} \quad (9a)$$

and $$I_L + I_8 \frac{(1 - K_{10})}{K_7} + \quad (9b)$$

$$\left\{ V_1 G_4 \left[ 1 - \frac{1}{K_8} \left( \frac{K_{10}}{K_7} - 1 \right) \right] \right\} = 0$$

or $$I_L + \frac{I_8(1 - K_{10})}{K_7} + \frac{V_1 G_f}{S} = 0 \quad (9c)$$

Since $G_4 \left[ 1 - \frac{1}{K_8} \left( \frac{K_{10}}{K_7} - 1 \right) \right] = \frac{G_f}{S}$ It should be noted that $I_L$ and $S$ are YIG device parameters which will vary as YIG devices are changed. $G_4$ and $V_1$ are driver parameters which cannot be varied, and $K_7$, $K_8$, $K_{10}$ and $I_8$ are parameters of the normalizing circuits which can be adjusted to compensate for the changes in YIG device parameters so that the conditions of equations (9) are maintained. There is some choice in the available adjustments. Ideally, there would be independent gain and offset adjustments. However, from equation (7), the expression for the frequency, it is seen that any changes in the parameters which will compensate for sensitivity changes; that is, parameters included in the expression for $G_f$ in equation (9) will also effect the offset correction of $V_1$ and $I_8$. Therefore this circuit configuration does not provide for gain correction adjustments which do not also affect to the offset term. However, the parameter $I_8 = V_C/R_O$ can be used for offset adjustment without impacting the gain setting, and it is obviously easiest to adjust $V_C$ by an adjustment of a potentiometer $R_o$.

The gain adjustment can be implemented from either $$K_8 = \frac{R_8}{R_4},$$

$$K_{10} = \frac{R_{10}}{R_9 + R_{10}}$$

or $$K_7 = \frac{R_7}{R_6 + R_7}$$

Varying $K_8$ for the gain correction is ruled out since this approach implies the use of a highly accurate, high-power potentiometer, as the current sensing resistor. Varying $K_{10}$ can be accomplished by making $R_{10}$ a variable resistor while keeping $R_9$ fixed in order to maintain a constant load resistance on the voltage sense mode. Varying $K_7$ can be accomplished as a variable voltage divider with $R_6$ and $R_7$ each varying, but their sum is held constant.

To determine the desirability of the use of $K_7$ or $K_{10}$ as the gain control, the method of alignment must first be considered. For the alignment it is assumed that parameters associated with the driver are known and constant, parameters associated with the normalizer are also known and constant with the exception of the adjustable parameters but that their value can be measured, while parameters associated with the YIG are unknown but are bounded by the specification limits. The philosophy for the alignment is to make an estimate of the gain correction required by comparing the change in frequency between high and low settings to that which is desired. The effect on the low frequency value of this estimated gain correction is determined and the gain adjustment is made to cause the low frequency response to be correct. Since the exact values of particular YIG parameters are not available, it is anticipated that this process will need to be repeated several times before the necessary tuning is accomplished.

This process is as follows.
1. Compute $\partial(\Delta F)/\partial K_i$, the sensitivity of the change in the frequency difference between high and low setting to the change in the selected gain adjustment parameter, either $K_7$ or $K_{10}$.
2. Compute the approximate correction in $K_i$ from $$\Delta F = f(-V_H) - f(0)$$

and $$\Delta K_i = \frac{\Delta F - (f_H - f_L)}{\frac{\partial(\Delta F)}{\partial K_i}}$$

where
$f(-V_H)$ = actual frequency response for $V_T = -V_H$
$f(0)$ = actual frequency response for $V_T = 0$
$f_{H1}, f_L$ = defined band limits
3. Compute $f(0)/K_i$, the sensitivity of the change in the low frequency setting to the change in the selected gain adjustment parameter, $K_7$ or $K_{10}$.
4. Compute the change in $f(0)$ caused by the change in $K_i$, that is $$\Delta f(0) = \partial f(0)/\partial K_i \, \Delta K_i$$

5. Adjust $K_i$ so that $$f(0)_k = f(0)_{k-1} - \Delta f(0)$$

6. Adjust $I_8$ so that $$f(0) = f_L$$

7. Determine if $$f(-V_H) = f_H$$

If not, repeat from step 2.
The implementation of this scheme depends primarily on the expression for $$\frac{\partial(\Delta F)}{\partial K_7} \quad \text{and} \quad \frac{\partial(\Delta F)}{\partial K_{10}}.$$

From equation (7), it is seen that $$\Delta F = -s \, G_4 \, V_T \left[ 1 - \frac{1}{K_8} \left( \frac{K_{10}}{K_7} - 1 \right) \right] \Bigg|_{V_T = -V_H}$$

then $$\frac{\partial(\Delta F)}{\partial K_7} = \frac{S \, G_4 \, V_H \, K_{10}}{K_8} \, 2\left(\frac{1}{K_7^2}\right)$$

and $$\frac{\partial(\Delta F)}{\partial K_{10}} = -\frac{S \, G_4 \, V_H}{K_7 \, K_8}$$

Giving $$\Delta K_7 = \frac{K_8 \, K_7^2}{S \, V_H \, G_4 \, K_{10}} [\Delta F - (f_H - f_L)]$$

and $$\Delta K_{10} = -\frac{K_7 \, K_8}{S \, V_H \, G_4} [\Delta F - (f_H - f_L)]$$

Next find $$\frac{\partial f(0)}{\partial K_7} \quad \text{and} \quad \frac{\partial f(0)}{\partial K_{10}}.$$

Again from equation (7) it is seen that $$f(0) = f_L - S \, I_L + I_8(1-K_{10}) + V_1 G_4 \left[ 1 - \frac{1}{K_8}\left(\frac{K_{10}}{K_7} - 1\right) \right]$$

so that $$\frac{\partial f(0)}{\partial K_7} = \frac{S}{K_7} Z_b \left[ I_8(1-K_{10}) - \frac{V_1 \, G_4 \, K_{10}}{K_8} \right]$$

and $$\frac{\partial f(0)}{\partial K_{10}} = \frac{S}{K_7}\left( I_8 + \frac{V_1 G_4}{K_8} \right)$$

The adjustment of the gain is accomplished by causing $$f(0)_k = f(0)_{k-1} - \Delta f(0)$$

For $K_7$ adjustment, $$\Delta f(0) = \frac{\partial f(0)}{\partial K_7} \Delta K_7 = \frac{S}{K_7 Z}\left( I_8(1-K_{10}) - \frac{V_1 G_4 K_{10}}{K_8}\right) \cdot \frac{K_8 K_7^2}{S V_H G_4 K_{10}}[\Delta F - (f_H - f_L)] =$$

$$[\Delta F - (f_H - f_L)] \cdot \left[ \frac{I_8(1-K_{10})}{K_{10}} \cdot \frac{K_8}{V_H G_4} - \frac{V_1}{V_H} \right]$$

and $$f(0)_k = f(0)_{k-1} -$$
$$(\Delta F - (f_H - f_L)) \left[ \frac{I_8(1-K_{10})}{K_{10}} \cdot \frac{K_8}{V_H G_4} - \frac{V_1}{V_H} \right]$$

for $K_{10}$ adjustment $$\Delta f(0) = \frac{\partial f(0)}{\partial K_{10}} \cdot \Delta K_{10} =$$

$$-\frac{S}{K_7}\left( I_8 + \frac{V_1 G_4}{K_8} \right) \cdot \frac{K_7 K_8}{S V_H G_4}(\Delta F - (f_H - f_L)) =$$

$$-(\Delta F - (f_H - f_L)) \cdot \left( \frac{I_8 K_8}{V_H G_4} + \frac{V_1}{V_H} \right)$$

and $$f(0)_k = f(0)_{k-1} + (\Delta F - (f_H - f_L)) \cdot \left( \frac{I_8 K_8}{V_H G_4} + \frac{V_1}{V_H} \right)$$

Note that in each case the change in f(0) which is caused by the gain adjustment to correct the value of $\Delta F$ depends, with the exception of $I_8$, on known and constant parameters. The value of $I_8$ will have to be obtained by the measurement $V_c$ at the wiper of the offset control. After the $K_7$ adjustment that makes $$f(0)_k = f(0)_{k-1} - \Delta f(0),$$

then $I_8$ is adjusted to give $f(0) - f_L$.

The desired setting of the normalizer circuit as well as the needed adjustment range to properly compensate for YIG device variation can be determined by considering equations (9a) and (9c) together with equation (5).

Choosing $K_7$ as the gain adjustment, equation (9a) is solved for $K_7$ giving $$K_7 = \frac{K_{10}}{1 + K_8 (1 - \frac{G_f}{S G_4})}$$

Let $G_f = S_0 G_4$, with $S_0$=response for $K_7 = K_{10}$ then $$K_7 = \frac{K_{10}}{1 + K_8 (1 - \frac{S_0}{S})}$$

The range of $K_7$, giving as the ratio of $\overline{K}_7 = K_7$ maximum, to $\underline{K}_7 = K_7$ minimum can be determined by $$R = \frac{\overline{K}_7}{\underline{K}_7} = \frac{1 + K_8 (1 - \frac{S_0}{\underline{S}})}{1 + K_8 (1 - \frac{S_0}{\overline{S}})},$$

where $\overline{S}$=maximum tuning sensitivity, and $\underline{S}$=minimum tuning sensitivity.

To limit range of $K_7$, requires that R is less than maximum allowed limiting value of Ro,
  with R<Ro and
  Solving for $K_8$ gives $$K_8 < \frac{Ro - 1}{S_0 \left( \frac{Ro}{\underline{S}} - \frac{1}{\overline{S}} \right) - (Ro - 1)}$$

The voltage divider action of $K_7$ required that $$K_7 = \frac{K_{10}}{1 + K_8 (1 - \frac{S_0}{S})} < 1$$

or $K_{10} < 1 + K_8 (1 - S_0/S)$
Solving equation (9c) for $I_8$ gives $$I_8 = - \frac{K_7}{1 - K_{10}} \left[ I_L + \frac{V_1 G_f}{S} \right]$$

Substituting for $K_7$
  then $$I_8 = - \frac{K_{10}}{1 - K_{10}} \frac{I_L + \frac{V_1 G_f}{S}}{1 + K_8 (1 - \frac{S_0}{S})}$$

In order to reference the outset adjustment to ground, it is necessary that $I_8$ be unipolar; that is $I_8 > 0$, which requires with $K_{10} < 1$ and $$\left| 1 - \frac{S_0}{S} \right| < 1,$$

$$-(I_L + \frac{V_1 G_f}{S}) > 0,$$

or $-V_1 > \frac{I_L S}{G_f}$

For $I_8 > 0$ for all YIG devices, then $$-V_1 > \frac{(\overline{I}_L + I_0) \underline{S}}{G_f}$$

where
  $\overline{I}_L$=maximum value of low frequency current,
  $I_0$=minimum value of compensation current, and
  $\overline{S}$=maximum value of tuning sensitivity,
with $-V_1$ taken at this limiting value $$I_8 = \frac{K_{10}}{1 - K_{10}} \frac{\overline{S}(\overline{I}_L + I_0) - S I_L}{S(K_8 + 1) - S_0 K_8}$$

to satisfy equation (9c).

The final constraint to be satisfied is that the compensation current, $I_c$, cannot be negative, or from equation (5).

$$I_c = \frac{I_8 (1 - K_{10})}{K_7} + \frac{G_4}{K_8} \left( \frac{K_{10}}{K_7} - 1 \right) - (V_T + V_1) > 0$$

Putting into equation (5)

$$K_7 = \frac{K_{10}}{1 + K_8 (\frac{S - S_0}{S})}$$

$$-V_1 = \frac{\overline{S} \overline{I}_L}{G_f}$$

$$G_f = S_0 G_4$$

$$I_8 = \frac{K_{10}}{1 - K_{10}} \frac{\overline{S}(\overline{I}_L + I_0) - S I_L}{S(K_8 + 1) - S_0 K_8}$$

yields, $$I_C = \frac{\overline{S}}{S_0} (\overline{I}_L + I_0) - I_L + G_f \frac{S - S_0}{S S_0} (-V_T)$$

requiring that $I_C > I_0$, which leads to the condition that $$S_0 < \frac{\overline{S} (\overline{I}_L + I_0) G_f (-V_T)}{I_0 I_L \frac{G_f}{S} (-V_T)}.$$

For this condition to be satisfied for all YIG's of a given type, then $S_0$ must be less than the least value of the right-hand side of the inequality which is obtained with maximum $I_L$, minimum S and maximum $|V_T|$.

The limiting value is given by $$S_0 = \frac{S(\bar{I}_L + I_0) + G_f(\overline{-V_T})}{I_0 + \bar{I}_L + \frac{G_f}{S}(\overline{-V_T})}$$

Figure 4:
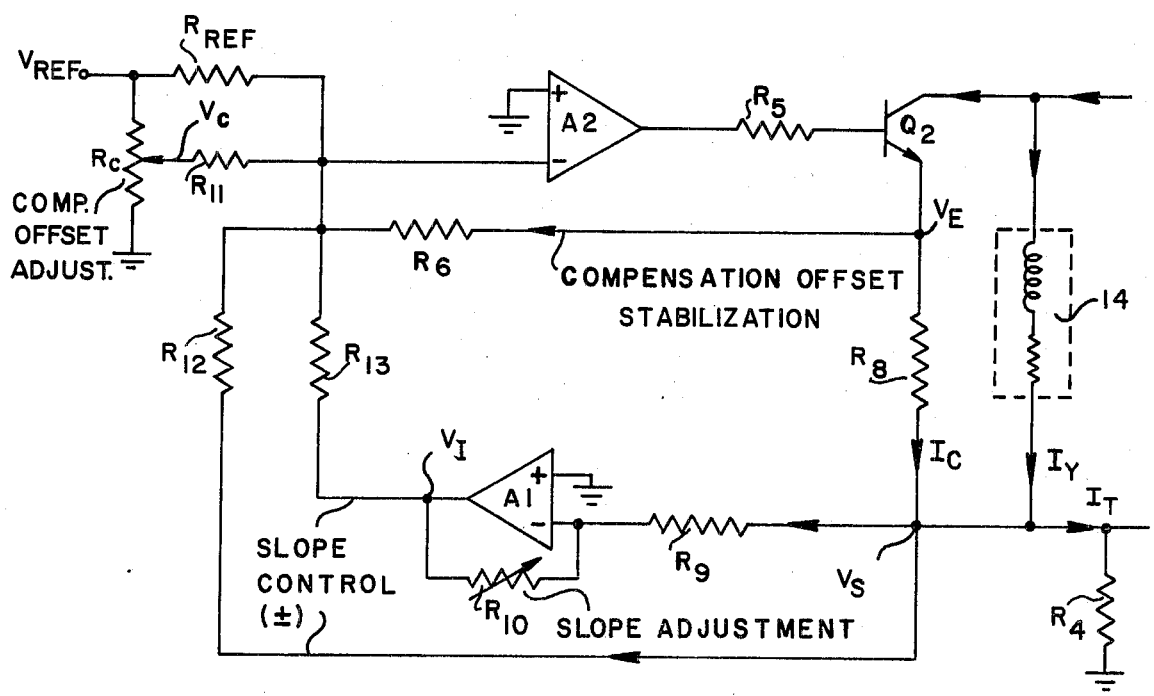
FIG. 4 is a circuit diagram of a second embodiment of a normalizing circuit.

Referring now to FIG. 4, a more complex normalizing circuit is shown which uses a summing junction at the inverting input terminal of amplifier A2 in order to keep the offset and gain (slope) controls as independent as possible, and to permit generating negative as well as positive slopes of compensating current ($I_c$ versus $V_s$) by adding voltages $V_I$ and $V_s$ through resistors $R_{13}$ and $R_{12}$. For convenience in understanding the organization and operation of this second exemplary embodiment, the same reference numerals are retained for those elements common in function to elements in the embodiment of FIG. 3, but it should be noted that the transistor $Q_1$ is here chosen to be an NPN transistor $Q_2$ in order to be able to place the $I_c$ sensing resistor $R_8$ in the emitter circuit where it will have less effect on the operation of the transistor.

If the resistors are selected to have the following relative sizes,
$R_6 >> R_8$
$R_9 >> R_4$
$R_9 >> R_8$
$R_{12} >> R_4$
$R_{12} >> R_8$
$R_{11} >> R_c$
then $$I_c = G_8[V_E - V_S] = G_8[K_{ref}V_{ref} + K_{11}V_c - (1 + K_2 - K_3)V_S] \quad (10)$$

where $$G_8 = \frac{1}{R_8}, K_1 = \frac{R_6}{R_{11}}, K_{ref} = \frac{R_6}{R_{ref}}, K_2 = \frac{R_6}{R_{12}},$$

$$K_3 = \left(\frac{R_6}{R_{13}}\right)\left(\frac{R_{10}}{R_9}\right)$$

Since $(+K_2 - K_3)$ is the term for gain (slope), and $K_{ref}V_{ref} + K_{11}V_c$ is the term for offset, it is evident that offset is independent of gain.

Although particular embodiments of the invention have been described and illustrated herein, it is recognized that modifications and equivalents may readily occur to those skilled in the art and consequently it is intended that the claims be interpreted to cover such modifications and equivalents.

The embodiments of the invention in which an exclusive property or privilege is claimed are defined as follows:

1. Apparatus for normalizing a device which has a current-controlled frequency response, such as a YIG or a TWM device, to a predetermined current-frequency characteristic in order that a device equipped with such apparatus can, through said apparatus, be preadjusted for substitution in a system for a like device without realigning the system, said normalizing apparatus being connected in parallel with the device, comprising a transistor and a compensating current-sensing resistor in series with said transistor and with a load resistance, said transistor and series resistor being connected in parallel with said device to conduct a shunt compensating current, $I_C$, through the transistor, first feedback control means connected to a junction between said transistor and series resistor for applying a control voltage to said transistor whereby said compensating current is set to a desired level to offset the current-frequency characteristic of the composite device and apparatus from that of the device to a predetermined level, and second feedback control means connected to a junction between said series resistor and said load resistance for applying a feedback control voltage to said transistor to adjust the offset characteristic to a predetermined slope by adjusting the gain of said feedback control means.

2. A circuit for normalizing the characteristic response of a current-controlled device, where the device may have a particular response characteristic located anywhere between a known upper limit and some lower limit of minimum and maximum control current levels, said circuit being connected in parallel with said device for use in a system which produces drive current to control operation of said device with a predetermined characteristic response between minimum and maximum control current levels above said known upper limit, whereby any device with said circuit connected thereto may be used in said system without realignment of said system, said system having a load resistance connected in series with said device to sense the total current, $I_T$, produced by said system for conduction between input and output terminals of said device, and to produce a sensed voltage, $V_S$, proportional to said total current, said circuit comprising a resistor, a variable resistance element having an input terminal, an output terminal, and a control terminal, and having its input and output terminals connected in series with said resistor, between said input and output terminals of said device for said control current to shunt a compensation current, $I_C$, thereby to leave a drive current, $I_Y$, through said device equal to $I_T$-$I_C$, said series-connected resistor serving to sense the compensation current and produce a proportional voltage, means connected to the control terminal of said variable resistance element for setting the static level of compensation current at a level which offsets the device characteristics to a predetermined characteristic above said known upper limit, feedback control means connected between said series-connected resistor and the control terminal of said variable resistance element for dynamic control of said level of compensation current, and feedback control means connected between said system load resistance and the control terminal of said transistor for controlling the level of compensation current in response to said sensed voltage, $V_S$, said positive feedback means including means for adjusting the gain of positive feedback control.

3. A circuit as defined in claim 2 wherein said variable resistance element is a transistor having an emitter, collector and base, and wherein the base of said transistor is used as a control terminal.

4. A circuit as defined in claim 3 including a first operational amplifier having an inverting input terminal, a noninverting input terminal, and an output terminal, means for coupling the output of said transistor to said noninverting input terminal, means for coupling the junction between said resistor and said load resistance to said inverting input terminal, a feedback circuit coupling the output of said first operational amplifier to the junction between said resistor and said load resistance, and means for coupling the output of said first operational amplifier to the base electrode of said transistor.

5. A circuit as defined in claim 4 wherein said transistor is a PNP type, and said last named means is comprised of a second operational amplifier having an inverting input terminal connected to the output of the first operational amplifier, and an output terminal connected to said base electrode of said transistor, and means for producing an offset voltage signal on said noninverting input terminal of said second operational amplifier for setting said static level.

6. A circuit as defined in claim 5 wherein said means for coupling the output of said transistor to said noninverting input terminal of said first operational amplifier is comprised of a voltage-dividing network having a resistance several orders or magnitude greater than said resistor in series with said variable-resistance element so as to conduct a negligible amount of current away from said resistor.

7. A circuit as defined in claim 4 wherein said transistor is an NPN type, and said last named means is comprised of a second operational amplifier having an inverting input terminal connected to the output of the first operational amplifier, and an output terminal connected to said base electrode of said transistor, and means for producing an offset voltage signal on said noninverting input terminal of said second operational amplifier for setting said static level.

8. A circuit as defined in claim 7 is comprised of a resistor having a resistance several orders of magnitude greater than said resistor in series with said variable resistance element so as to conduct a negligible amount of current away from said resistor.

9. A circuit as defined in claim 8 including a feedback resistor connected between the emitter of said transistor to the inverting input terminal of said second operational amplifier, said feedback resistor having a resistance several orders of magnitude greater than said resistor in series with said variable resistance element so as to conduct a negligible amount of current away from said resistor.

10. A circuit as defined in claim 9 including an additional feedback resistor connected between the junction of said load resistance and said resistor in series with said variable resistance element, said additional feedback resistor having a resistance several orders of magnitude greater than said resistor in series with said variable resistance element so as to conduct a negligible amount of current away from said resistor.

11. A circuit as defined in claim 10 wherein said feedback circuit coupling the output of said first operational amplifier to the junction between said resistor and said load resistance is comprised of a variable resistance means for adjustment of the slope of said offset characteristic.

12. A method for normalizing a chosen one of a number of like devices to a predetermined characteristic response of a parameter to a controlled current for substitution in a system without necessity of realining the system, wherein said predetermined characteristic is at a level outside a range of levels of devices without normalization, comprising the steps of providing a shunt current path in parallel with said chosen device, said shunt current path having feedback control of shunt current conducted, adjusting the level of shunt current through said path to offset the characteristic response of said device outside said range, and adjusting the slope of the offset characteristic to a predetermined value by adjusting the gain of the feedback control in said current path.

* * * * *